(12) United States Patent
Pu et al.

(10) Patent No.: US 8,369,172 B2
(45) Date of Patent: Feb. 5, 2013

(54) INTEGRATED CIRCUITS FOR PROVIDING CLOCK PERIODS AND OPERATING METHODS THEREOF

(75) Inventors: Chiang Pu, San Jose, CA (US); Ming-Chieh Huang, San Jose, CA (US); Chan-Hong Chern, Palo Alto, CA (US)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 259 days.

(21) Appl. No.: 12/844,204

(22) Filed: Jul. 27, 2010

(65) Prior Publication Data

US 2012/0026820 A1 Feb. 2, 2012

(51) Int. Cl.
*G11C 7/00* (2006.01)
(52) U.S. Cl. .................................. 365/222; 365/189.05
(58) Field of Classification Search .................. 365/222, 365/189.05
See application file for complete search history.

(56) References Cited

U.S. PATENT DOCUMENTS

| | | | |
|---|---|---|---|
| 6,642,804 B2 * | 11/2003 | Chrissostomidis et al. | .. 331/143 |
| 6,853,563 B1 * | 2/2005 | Yang et al. | ... 363/21.15 |
| 7,262,640 B2 * | 8/2007 | Yonezawa et al. | ..... 327/101 |
| 8,124,922 B2 * | 2/2012 | Koyama et al. | .... 250/214 R |
| 2004/0066149 A1 * | 4/2004 | Gray | ........ 315/244 |
| 2006/0170463 A1 * | 8/2006 | Yonezawa et al. | ..... 327/101 |
| 2009/0251178 A1 * | 10/2009 | Choi et al. | ..... 327/131 |

* cited by examiner

*Primary Examiner* — Michael Tran
(74) *Attorney, Agent, or Firm* — Lowe Hauptman Ham & Berner, LLP

(57) ABSTRACT

An integrated circuit includes a capacitor. A switch is electrically coupled with the capacitor in a parallel fashion. A comparator includes a first input node, a second input node, and an output node. The second input node is electrically coupled with a first plate of the capacitor. The output node is electrically coupled with the switch. A transistor is electrically coupled with a second plate of the capacitor. A circuit is electrically coupled with a gate of the transistor. The circuit is configured to provide a bias voltage to the gate of the transistor so as to control a current that is supplied to charge the capacitor.

20 Claims, 9 Drawing Sheets

INTEGRATED CIRCUITS FOR PROVIDING CLOCK PERIODS AND OPERATING METHODS THEREOF

TECHNICAL FIELD

The present disclosure relates generally to the field of semiconductor circuits, and more particularly, to integrated circuits for providing clock periods and operating methods thereof.

BACKGROUND

Memory circuits have been used in various applications. Conventionally, a dynamic random access memory (DRAM) circuit includes a plurality of memory cells. For a conventional DRAM circuit in which arrays of capacitive storage memory cells are provided, each memory cell has an access transistor. Data stored in such memory cells is actually a charge stored on a small capacitor. When the data are to be output, the access transistor is activated by a word line (WL) that is electrically coupled to the gate or control terminal of the transistor. The access transistor can couple the capacitor to a bit line (BL) coupled to a sense amplifier for sensing the voltage of the capacitor.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the numbers and dimensions of the various features may be arbitrarily increased or reduced for clarity of discussion.

DETAILED DESCRIPTION OF THE DISCLOSURE

Figure 1A:
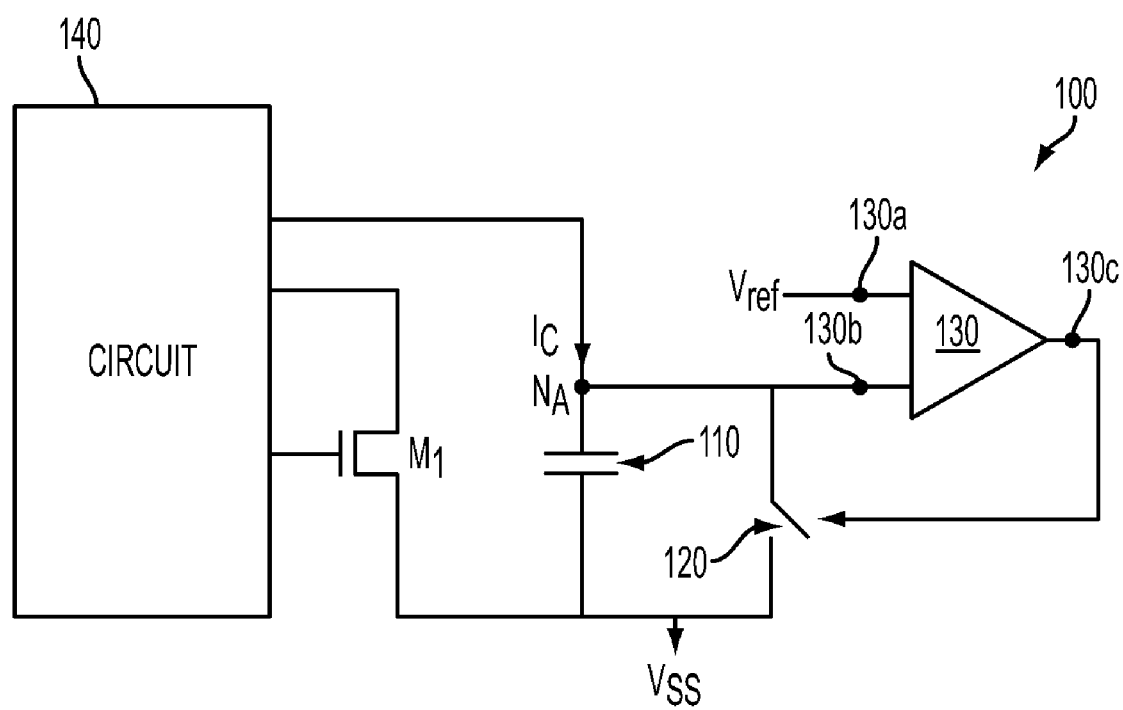
FIG. 1A is a schematic drawing illustrating an exemplary integrated circuit for providing a clock period.

Data stored in memory cells of the DRAM circuit are vulnerable because of charge leakages of the memory cells. To retain the data stored in the DRAM circuit, a refresh operation is periodically applied to the DRAM circuit to recharge capacitors of the memory cells. Generally, a temperature-controlled oscillator (TCO) has been used to provide a refresh period or refresh frequency for the refresh operation.

The TCO has a capacitor electrically coupled with a switch. A fixed current is provided to charge the capacitor. A comparator compares a voltage level on a top plate of the capacitor and a reference voltage that is inversely proportional to absolute temperature. If the voltage level is higher than the reference voltage, the switch is closed such that charges stored in the capacitor can be discharged and the voltage level on the top plate of the capacitor declines. If the voltage level is lower than the reference voltage, the switch is opened such that the capacitor can be charged by the fixed current and the voltage level on the top plate of the capacitor increases. By detecting the open-close state of the switch, the refresh period or the refresh frequency is provided.

It is found that the environmental temperature around the DRAM circuit affects the charge leakages. If the environmental temperature increases, the charge leakages of the memory cell capacitors also increase. The refresh period should be shortened and the refresh frequency should be increased to refresh the memory cells. If the environmental temperature decreases, the charge leakages of the memory cell capacitors are decreased. The refresh frequency can be slowed down. It is proposed that the refresh frequency at 125° C. should be about six times the refresh frequency at 25° C.

It is understood that the following disclosure provides many different embodiments, or examples, for implementing different features of the disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled with or to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

FIG. 1A is a schematic drawing illustrating an exemplary integrated circuit for providing a clock period. In FIG. 1A, an integrated circuit 100 for providing a clock period can include a capacitor 110, a switch 120, a comparator 130, a transistor $M_1$, and a circuit 140. In some embodiments, the integrated circuit 100 can be configured to provide a clock period for refreshing memory cells (not shown), such as dynamic random access memory (DRAM) cells or embedded DRAM cells. The clock period can be converted to a clock frequency for refreshing memory cells. In other embodiments, the integrated circuit 100 can be referred to as a temperature-controlled oscillator (TCO) or a temperature-tracking clock generator.

Referring to FIG. 1A, the switch 120 can be electrically coupled with the capacitor 110 in a parallel fashion. In some embodiments, the capacitor 110 and the switch 120 can be electrically coupled with a power line that can provide a power voltage, e.g., a power voltage $V_{SS}$ or ground. The comparator 130 can include input nodes 130a, 130b and an output node 130c. The input node 130a can be configured to receive a reference voltage $V_{ref}$. In some embodiments, the reference voltage $V_{ref}$ can be temperature independent. The input node 130b can be electrically coupled with a plate of the capacitor 110 and the switch 120. The output node 130c can be electrically coupled with the switch 120. In some embodiments, the comparator 130 can be configured to compare the reference voltage $V_{ref}$ and a voltage level $V_C$ on a node $N_A$ that is electrically coupled with the plate of the capacitor 110. The comparator 130 can output a comparison result on the output node 130c so as to close or open the switch 120.

Referring to FIG. 1A, the transistor $M_1$ can be electrically coupled with a plate of the capacitor 110. In some embodiments, the transistor $M_1$ can be referred to as a tail transistor. In some embodiments using an N-type transistor, a source of the transistor $M_1$ can be electrically coupled with the capacitor 110 and the power voltage $V_{SS}$ or ground. A gate and a drain of the transistor $M_1$ can be electrically coupled with the circuit 140. The circuit 140 can be configured to control the transistor $M_1$. In some embodiments, the circuit 140 can be configured to provide a bias voltage $V_{bias}$ to the gate of the transistor $M_1$ so as to control a current $I_C$ that is supplied to charge the capacitor 110. In some embodiments, the transistor $M_1$ can be a P-type transistor. Voltages applied to the P-type transistor can be opposite to those applied to the N-type transistor.

As noted, the reference voltage $V_{ref}$ can be temperature independent. The term "temperature independent" here means that the reference voltage $V_{ref}$ is substantially free from being affected by the environmental temperature. The circuit 140 can be configured to provide a bias voltage $V_{bias}$ to the gate of the transistor $M_1$ so as to control the current $I_C$. In some embodiments, the bias voltage $V_{bias}$ is programmable and temperature dependent. The term "programmable" here means that the bias voltage $V_{bias}$ can be adjusted by adjusting at least one parameter, such as one or more impedances and/or resistances of at least one component within the circuit 140, and/or a proportional factor. By adjusting the bias voltage $V_{bias}$, the current $I_C$ can be adjusted in correspondence to a change of environmental temperature around the circuit 100. In some embodiments, if the environmental temperature goes up, the bias voltage $V_{bias}$ is raised to increase the current $I_C$ for charging the capacitor 110. Because a large current is provided to charge the capacitor 110, the clock period for refreshing memory cells can be thus reduced. In other embodiments, if the environmental temperature goes down, the bias voltage $V_{bias}$ is lowered to decrease the current $I_C$ for charging the capacitor 110. Because a small current is provided to charge the capacitor 110, the clock period for refreshing memory cells can be increased. In still other embodiments, the circuit 100 can provide a refresh frequency at 125° C. that can be about six times the refresh frequency at 25° C.

Figure 1B:
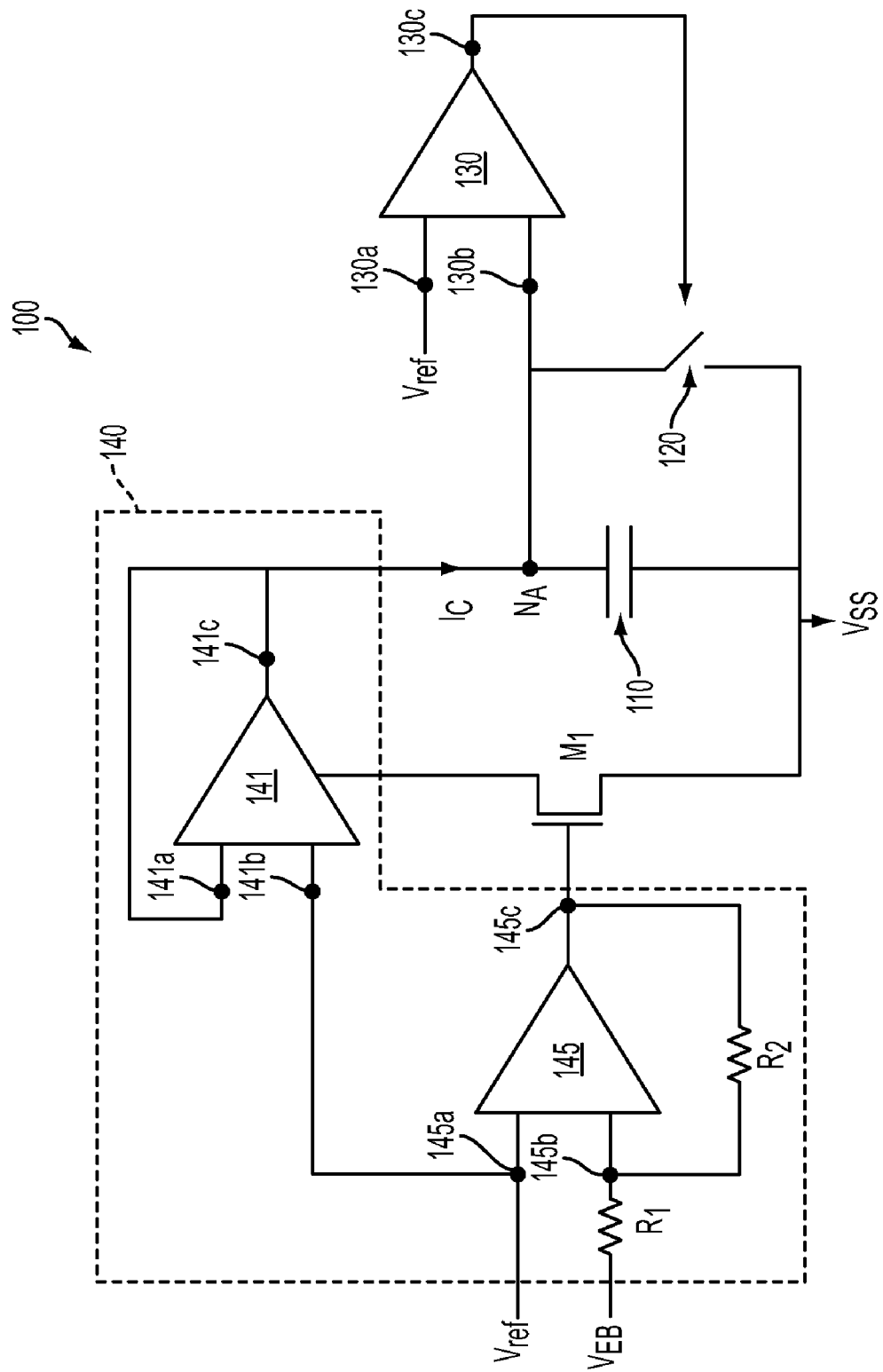
FIG. 1B is a schematic drawing illustrating another exemplary integrated circuit for providing a clock period.

FIG. 1B is a schematic drawing illustrating another exemplary integrated circuit. Items of FIG. 1B that are the same or similar items in FIG. 1A are indicated by the same reference numerals. In FIG. 1B, the circuit 140 can include a transconductance amplifier 141 that can be electrically coupled with the transistor $M_1$ and the capacitor 110. In some embodiments, the transconductance amplifier 141 can include input nodes 141a, 141b and an output node 141c. The input node 141a can be electrically coupled with the output node 141c, which can be electrically coupled with the capacitor 110. In some embodiments, the transconductance amplifier 141 can be configured to convert a voltage drop between the input nodes 141a and 141b to the current $I_C$.

Figure 2:
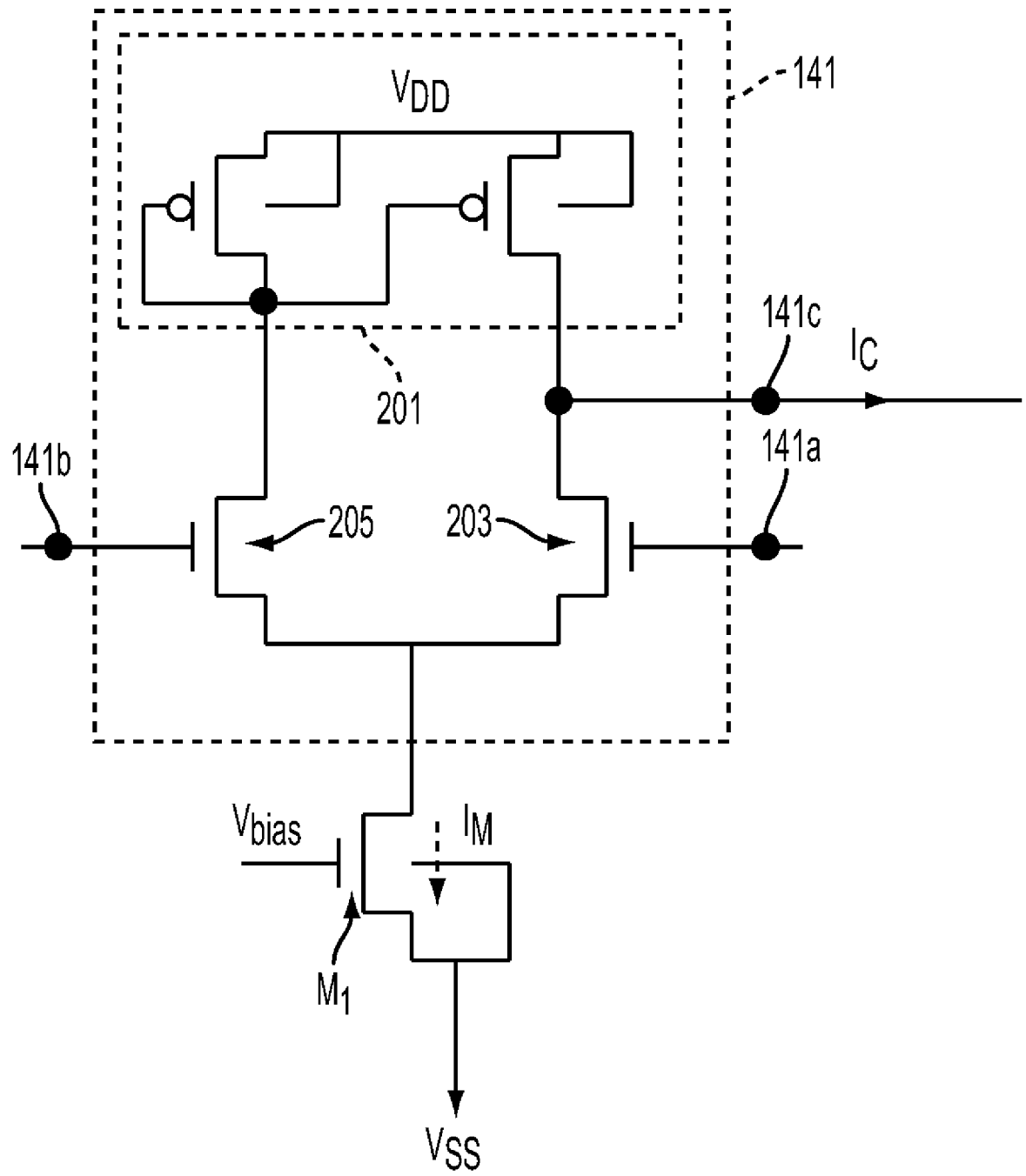
FIG. 2 is a schematic drawing illustrating an exemplary transconductance amplifier that is electrically coupled with a transistor.

In some embodiments, the transconductance amplifier 141 can include a current mirror 201 and a pair of transistors 203 and 205 as shown in FIG. 2. The transistors 203 and 205 can be electrically coupled in a parallel fashion between the current mirror 201 and the transistor $M_1$. Gates of the transistors 203 and 205 can be electrically coupled with the input nodes 141a and 141b, respectively. The output node 141c can be electrically coupled with a node (not labeled) that is between the current mirror 201 and the transistor 203. It is noted that the structure of the transconductance amplifier 141 shown in FIG. 2 is merely exemplary. Any structure of the transconductance amplifier that includes a current mirror may be used.

Referring again to FIG. 1B, the circuit 140 can include an amplifier 145. The amplifier 145 can include input nodes 145a, 145b and an output node 145c. The input node 145a can be electrically coupled with the input node 141b of the transconductance amplifier 141. The output node 145c can be electrically coupled with the gate of the transistor $M_1$. A resistor $R_1$ can be electrically coupled with the input node 145b. Another resistor $R_2$ can be electrically coupled between the input node 145b and the output node 145c. The resistor $R_1$ has a resistance $R_A$ and the resistor $R_2$ has a resistance $R_B$. In some embodiments, the resistors $R_1$ and $R_2$ can each be a fixed resistor or an adjustable resistor. The resistances $R_A$ and $R_B$ can each be a fixed resistance or an adjustable resistance.

In some embodiments, the input node 145a can be configured to receive the reference voltage $V_{ref}$. The resistor $R_1$ can be electrically coupled with a temperature-dependent voltage $V_{EB}$. In some embodiments, the temperature-dependent voltage $V_{EB}$ can be inversely proportional to absolute temperature. In other embodiments, the temperature-dependent voltage $V_{EB}$ can be provided from a bandgap reference circuit (not shown). The bandgap reference circuit can include a bipolar transistor (not shown). The temperature-dependent voltage $V_{EB}$ can be substantially equal to a voltage drop across an emitter and a base of the bipolar transistor.

Figure 3:
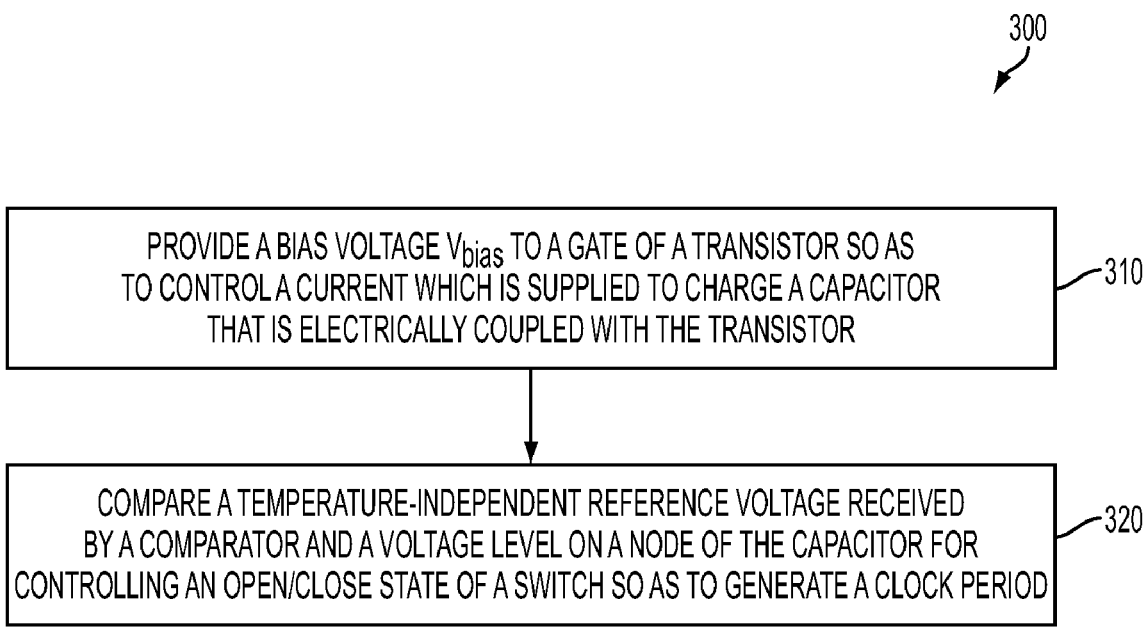
FIG. 3 is a flow chart illustrating an exemplary method of generating a clock period in view of the integrated circuit shown in FIG. 1B.

FIG. 3 is a flow chart illustrating an exemplary method of generating a clock period in view of the integrated circuit 100 shown in FIG. 1B. In FIG. 3, a method 300 of generating a clock period for refreshing memory cells can include providing a bias voltage $V_{bias}$ to a gate of a transistor so as to control a current that is supplied to charge a capacitor that is electrically coupled with the transistor (Step 310). In some embodiments using the integrated circuit 100 shown in FIG. 1B, the Step 310 can include providing the bias voltage $V_{bias}$ to the gate of the transistor $M_1$ so as to control a current $I_C$ that is supplied to charge the capacitor 110.

As noted, the bias voltage $V_{bias}$ can be programmable. In some embodiments, the bias voltage $V_{bias}$ can be adjusted by adjusting the resistances $R_A$ and $R_B$. The resistances $R_A$ and/or $R_B$ can be adjustable to achieve a desired bias voltage $V_{bias}$. In some embodiments, the bias voltage $V_{bias}$ can be represented below in Equation (1)

$$V_{bias} = V_{ref} + (V_{ref} - V_{EB}) \cdot \frac{R_B}{R_A} \tag{1}$$

wherein the reference voltage $V_{ref}$ is temperature independent, $V_{EB}$ is temperature dependent, and the resistances $R_A$ and $R_B$ can each be fixed or adjustable. From Equation (1), the bias voltage $V_{bias}$ can be adjusted by adjusting the ratio $R_B/R_A$.

In some embodiments, the environmental temperature around the integrated circuit 100 rises. If the environmental temperature increases, charge leakages of memory cells are increased. To retain data stored in the memory cells, the clock period should be shortened or the clock frequency should be increased. In this embodiment, the Step 310 can include increasing the bias voltage $V_{bias}$ to turn up the transistor $M_1$ so as to induce increasing the current $I_C$. For example, the increased bias voltage $V_{bias}$ can turn up the transistor $M_1$ as shown in FIG. 2. The turned-up transistor $M_1$ can increase a current $I_M$ flowing through the transistor $M_1$. The increased current $I_M$ can induce increasing the current $I_C$ that is provided to charge the capacitor 110 (shown in FIG. 1B).

The method 300 can include comparing the temperature-independent reference voltage $V_{ref}$ and the voltage level on the node $N_A$ of the capacitor 110 for controlling an open/close state of the switch 120 so as to generate the clock period (Step 320). If the voltage level on the node $N_A$ is higher than the reference voltage $V_{ref}$, the comparator 130 can output a signal, closing the switch 120, such that charges stored in the capacitor 110 can be discharged. If the voltage level on the node $N_A$ is lower than the reference voltage $V_{ref}$, the comparator 130 can output a signal, opening the switch 120, such that the current $I_C$ can be supplied to charge the capacitor 110. By detecting the close/open state of the switch 120, a clock period that is provided for refreshing memory cells can be generated.

In some embodiments, a clock period (T) for refreshing memory cells can be represented below in Equation (2)

$$T = C_x V_{ref}/I_C \quad (2)$$

wherein, $C_x$ represents the capacitance of the capacitor 110. As noted, the clock period T is inversely proportional to the current $I_C$. The reference voltage $V_{ref}$ is temperature independent. In some embodiments, the reference voltage $V_{ref}$ and the capacitance $C_x$ can be fixed factors. If the environmental temperature rises such that the current $I_C$ is increased, the clock period T can be reduced and the clock frequency can be increased.

In some embodiments, the environmental temperature around the integrated circuit 100 goes down. If the environmental temperature falls, charge leakages of memory cells may become small. To retain data stored in the memory cells, the clock period can be extended or the clock frequency can be slowed down. In this embodiment, the Step 310 can include decreasing the bias voltage $V_{bias}$ to turn down the transistor $M_1$ so as to decrease the current $I_C$. For example, the decreased bias voltage $V_{bias}$ can turn down the transistor $M_1$ as shown in FIG. 2. The turned-down transistor $M_1$ can decrease the current $I_M$ flowing through the transistor $M_1$. The decreased current $I_M$ can decrease the current $I_C$ that is provided to charge the capacitor 110 (shown in FIG. 1B). As noted, the clock period T is inversely proportional to the current $I_C$. By decreasing the current $I_C$, the clock period T can be proportionally increased and the clock frequency is decreased.

Figure 4:
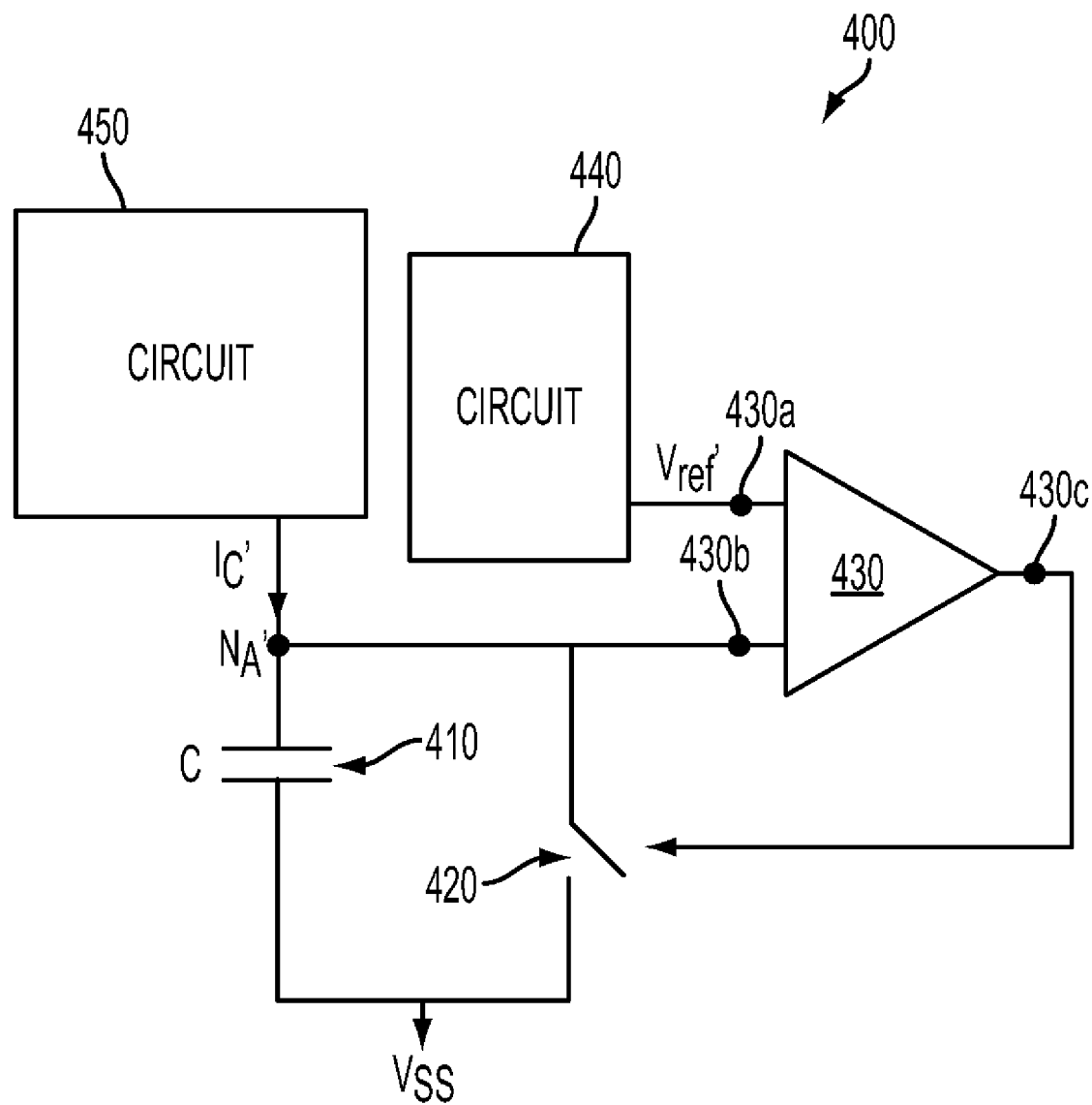
FIG. 4 is a schematic drawing illustrating an exemplary integrated circuit for providing a clock period.

FIG. 4 is a schematic drawing illustrating another exemplary integrated circuit for providing a clock period. In FIG. 4, an integrated circuit 400 can include a capacitor 410, a switch 420, a comparator 430, and circuits 440 and 450. In some embodiments, the integrated circuit 400 can be configured to provide a clock period for refreshing memory cells, such as dynamic random access memory (DRAM) cells or embedded DRAM cells. In other embodiments, the integrated circuit 400 can be referred to as a temperature-controlled oscillator (TCO) or a temperature-tracking clock generator.

Referring to FIG. 4, the switch 420 can be electrically coupled with the capacitor 410 in a parallel fashion. In some embodiments, the capacitor 410 and the switch 420 can be electrically coupled with a power line that can provide a power voltage, e.g., a power voltage $V_{SS}$ or ground. The comparator 430 can include input nodes 430a, 430b and an output node 430c. The input node 430b can be electrically coupled with a plate of the capacitor 410 and the switch 420. The output node 430c can be electrically coupled with the switch 420.

Referring to FIG. 4, the circuit 440 can be electrically coupled with the input node 430a of the comparator 430. The circuit 440 can be configured to provide a temperature-dependent reference voltage $V_{ref}'$ on the input node 430a. In some embodiments, the temperature-dependent reference voltage $V_{ref}'$ can be inversely proportional to absolute temperature. The circuit 450 can be electrically coupled with the capacitor 410. The circuit 450 can be configured to provide a temperature-dependent current $I_C'$ that is supplied to charge the capacitor 410. The comparator 430 can compare the temperature-dependent reference voltage $V_{ref}'$ and the voltage level $V_C'$ on the node $N_A'$. The comparison result output on the output end 430c is directed to control the open/close state of the switch 420. By detecting the open/close state of the switch 420, a clock period T' that is provided for refreshing memory cells can be generated.

In some embodiments, the temperature-dependent reference voltage $V_{ref}'$ is programmable. The term "programmable" here means that the reference voltage $V_{ref}'$ can be adjusted by adjusting one or more proportional factors and/or one or more impedances and/or resistances of at least one component of the circuit 440. In other embodiments, the temperature-dependent current $I_C'$ is programmable. The term "programmable" here means that the temperature-dependent current $I_C'$ can be adjusted by adjusting one or more proportional factors and/or one or more impedances and/or resistances of at least one component of the circuit 450. By adjusting the temperature-dependent reference voltage $V_{ref}'$ and/or the temperature-dependent current $I_C'$, the clock period T' can be modified.

As noted, the temperature-dependent reference voltage $V_{ref}'$ and/or the temperature-dependent current $I_C'$ can be adjusted in correspondence to a change of environmental temperature around the circuit 400. In some embodiments, if the environmental temperature rises, the temperature-dependent reference voltage $V_{ref}'$ can be reduced and/or the temperature-dependent current $I_C'$ can be increased. By adjusting the temperature-dependent reference voltage $V_{ref}'$ and/or the temperature-dependent current $I_C'$, the clock frequency for refreshing memory cells can be increased. In other embodiments, if the environmental temperature falls, the temperature-dependent reference voltage $V_{ref}'$ can be increased and/or the temperature-dependent current $I_C'$ can be reduced. By adjusting the temperature-dependent reference voltage $V_{ref}'$ and/or the temperature-dependent current $I_C'$, the clock frequency for refreshing memory cells can be reduced.

Figure 5:
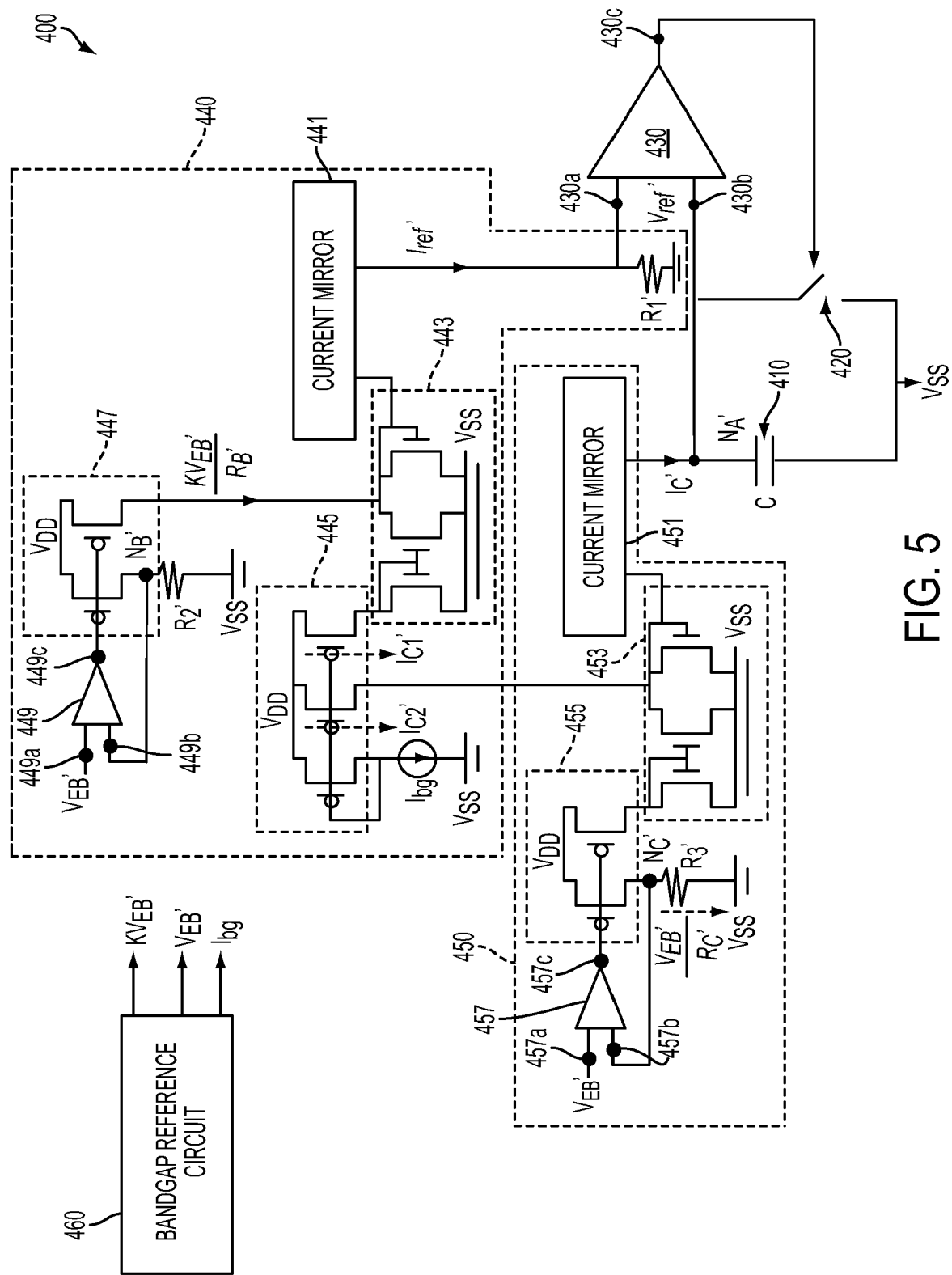
FIG. 5 is a schematic drawing illustrating another exemplary integrated circuit for providing a clock period.

FIG. 5 is a schematic drawing illustrating an exemplary integrated circuit. Items of FIG. 5 that are the same or similar items in FIG. 4 are indicated by the same reference numerals. In FIG. 5, the circuit 440 can include resistors $R_1'$ and $R_2'$ and at least one current mirror, e.g., current minors 441, 443, 445, and 447, and an amplifier 459. The resistor $R_1'$ can be electrically coupled with the input node 430a of the comparator 430. In some embodiments, the resistor $R_1'$ can be electrically coupled between the input node 430a and a power line that is configured to provide a power voltage, e.g., a power voltage $V_{SS}$ or ground. In other embodiments, the resistor $R_1'$ can be an adjustable resistor that can provide an adjustable resistance $R_A'$. In still other embodiments, the resistor $R_1'$ can have a fixed resistance.

Referring to FIG. 5, the current mirror 441 can be electrically coupled with the input node 430a of the comparator 430. The current mirror 443 can be electrically coupled with the current mirrors 441, 445, and 447. In some embodiments, the current mirror 443 can be electrically coupled with the current mirrors 441, 445, 447, and a power line that is configured to provide a power voltage, e.g., a power voltage $V_{SS}$ or ground.

Referring to FIG. 5, the resistor $R_2'$ can be electrically coupled with the current mirror 447. In some embodiments, the resistor $R_2'$ can be electrically coupled between the current mirror 447 and a power line that is configured to provide a power voltage, e.g., a power voltage $V_{SS}$ or ground. In other embodiments, the resistor $R_2'$ can be an adjustable resistor that can provide an adjustable resistance $R_B'$. In still other embodiments, the resistor $R_2'$ can have a fixed resistance.

Referring again to FIG. 5, the amplifier 449 can include input nodes 449a, 449b and an output node 449c. The input node 449a of the amplifier 449 can be configured to receive a temperature-dependent voltage $KV_{EB}'$. In some embodiments, $V_{EB}'$ represents a temperature-dependent voltage and K represents a proportionality constant. In some embodiments, the temperature-dependent voltage $KV_{EB}'$ can be provided from a bandgap reference circuit 460. In other embodiments, the bandgap reference circuit 460 can include a bipolar transistor 730 (shown in FIG. 7). The temperature-dependent voltage $V_{EB}'$ can be substantially equal to a voltage drop across an emitter and a base of the bipolar transistor 730. The input node 449b can be electrically coupled with a node $N_B'$ between the current mirror 447 and the resistor $R_2'$. The output node 449c can be electrically coupled with the current mirror 447.

Referring again to FIG. 5, the circuit 450 can be electrically coupled with the input end 430b of the comparator 430. In some embodiments, the circuit 450 can include a resistor $R_3'$, at least one current mirror, e.g., current mirrors 451, 453, and 455, and an amplifier 457.

In some embodiments, the current mirror 451 can be electrically coupled with the input node 430b of the comparator 430. The current mirror 453 can be electrically coupled between the current mirrors 451 and 455. In some embodiments, the current mirror 453 can be electrically coupled with the current mirrors 451, 455 and a power line that is configured to provide a power voltage, e.g., a power voltage $V_{SS}$ or ground.

Referring to FIG. 5, the resistor $R_3'$ can be electrically coupled with the current mirror 455. In some embodiments, the resistor $R_3'$ can be electrically coupled between the current mirror 455 and a power line that is configured to provide a power voltage, e.g., a power voltage $V_{SS}$ or ground. In other embodiments, the resistor $R_3'$ can be an adjustable resistor that can provide an adjustable resistance $R_C'$. In still other embodiments, the resistor $R_3'$ can have a fixed resistance.

Referring again to FIG. 5, the amplifier 457 can include input nodes 457a, 457b and an output node 457c. The input node 457a of the amplifier 457 can be configured to receive the temperature-dependent voltage $V_{EB}'$. The temperature-dependent voltage $V_{EB}'$ can be provided from the bandgap reference circuit 460. The input node 457b can be electrically coupled with a node $N_C'$ between the current mirror 455 and the resistor $R_3'$. The output node 457c can be electrically coupled with the current mirror 455.

Figure 6:
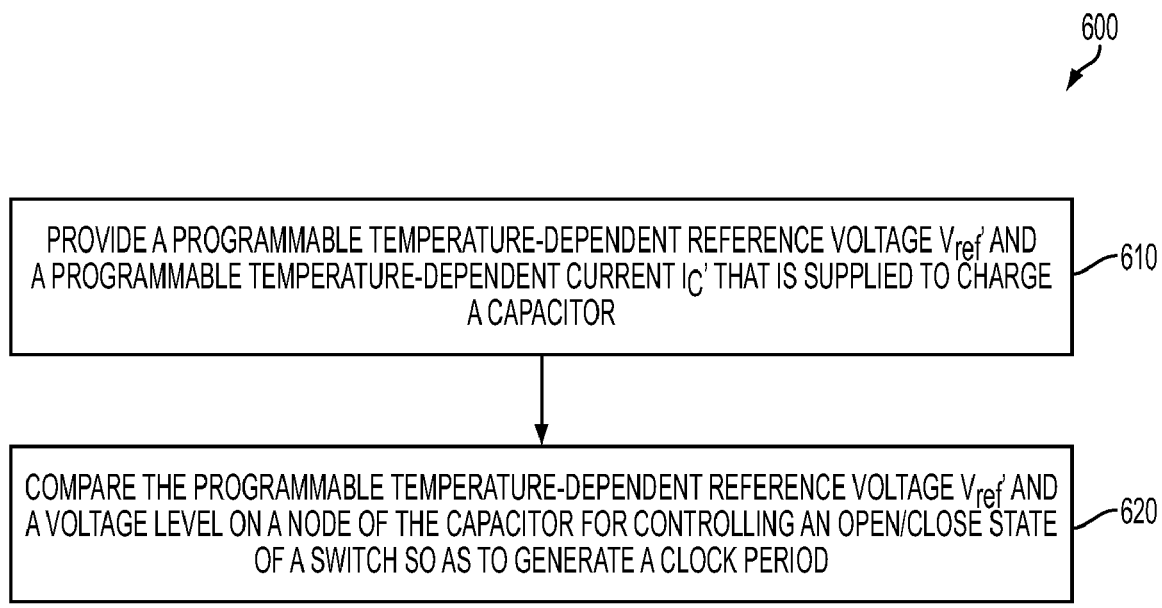
FIG. 6 is a flow chart illustrating an exemplary method of generating a clock period in view of the integrated circuit shown in FIG. 5.

FIG. 6 is a flow chart illustrating another exemplary method of generating a clock period in view of the integrated circuit 400 shown in FIG. 5. In FIG. 6, a method 600 of generating a clock period can include providing a temperature-dependent reference voltage and a temperature-dependent current that is supplied to charge a capacitor (Step 610). In some embodiments using the integrated circuit 400 shown in FIG. 5, the Step 610 can include providing the temperature-dependent reference voltage $V_{ref}'$ and the temperature-dependent current $I_C'$ that is supplied to charge the capacitor 410 (shown in FIG. 5).

In some embodiments for providing the temperature-dependent reference voltage $V_{ref}'$, the current mirror 445 (shown in FIG. 5) can provide a temperature-independent current $I_{bg}$. The temperature-independent current $I_{bg}$ can be provided or mirrored, for example, from the bandgap reference circuit 460.

Figure 7:
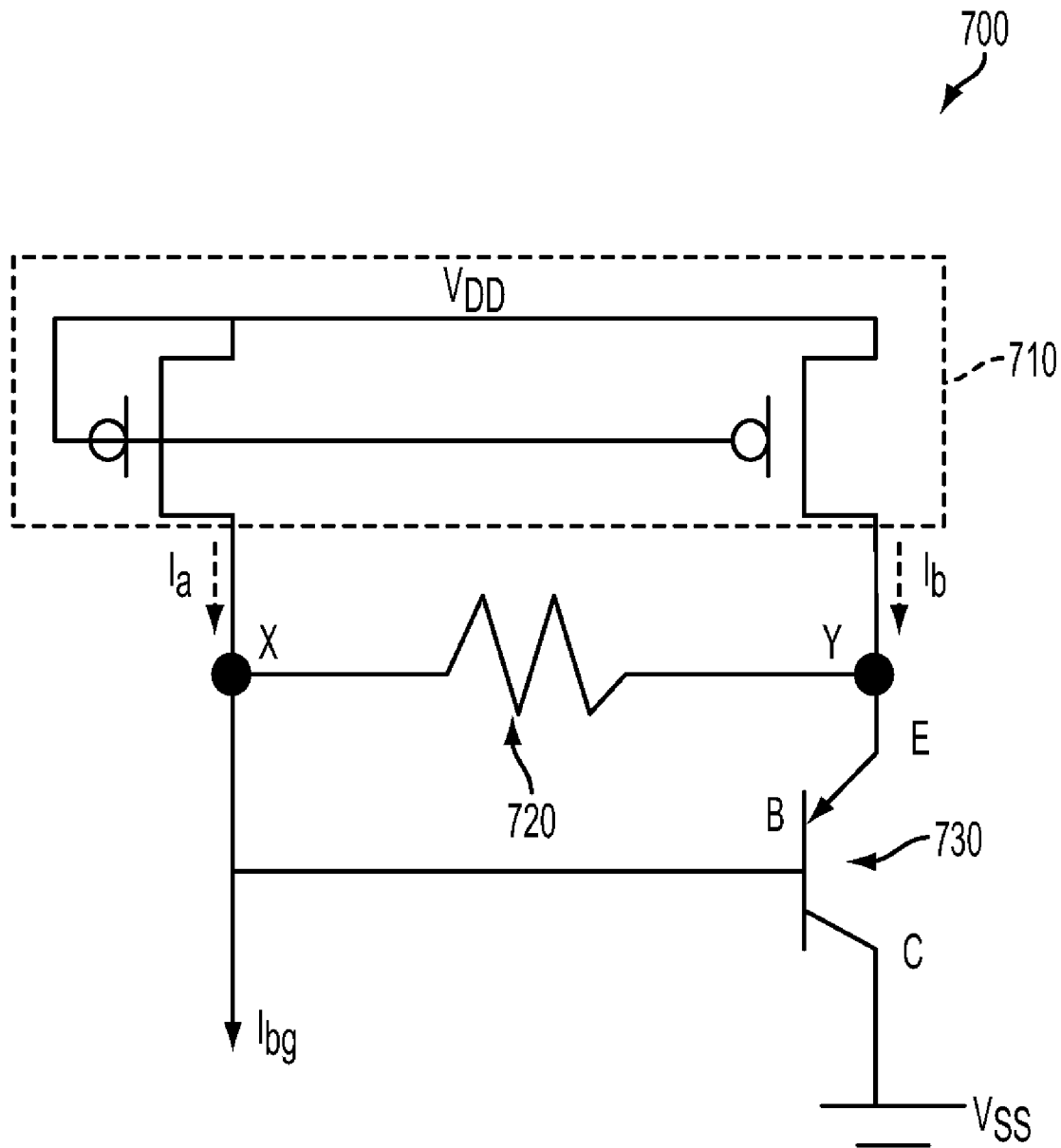
FIG. 7 is a schematic drawing illustrating a circuit that is configured to provide a temperature-independent current.

In some embodiments, a circuit 700 of the bandgap reference circuit 460 that is configured to provide the temperature-independent current $I_{bg}$ can include a current mirror 710, a resistor 720, and a bipolar transistor 730 as shown in FIG. 7. The resistor 720 can be disposed between nodes X and Y and electrically coupled with the current mirror 710. An emitter (E) of the bipolar transistor 730 can be electrically coupled with the node Y. A base (B) of the bipolar transistor 730 can be electrically coupled with the node X. A collector (C) of the bipolar transistor 730 can be electrically coupled with a power line that can provide a power voltage, e.g., a power voltage $V_{SS}$ or ground.

In some embodiments, the current mirror 710 can provide temperature-dependent currents $I_a$ and $I_b$ toward the nodes X and Y, respectively. The temperature-dependent currents $I_a$ can be substantially equal to or proportional to the temperature-dependent current $I_b$. In other embodiments, the temperature-dependent currents $I_a$ and $I_b$ both are proportional to absolute temperature (PTAT) currents. In still other embodiments, the temperature-independent current $I_{bg}$ can be represented as below in Equation (3)

$$I_{bg} = I_a + \frac{V_{EB}'}{R_X} \qquad (3)$$

wherein, $R_X$ represents a resistance of the resistor 720, and $V_{EB}'$ represents a voltage across the emitter and base of the bipolar transistor 730. The temperature-dependent voltage $V_{EB}'$ can be inversely proportional to absolute temperature. Since the temperature-dependent current $I_a$ is proportional to absolute temperature, the temperature effects of the temperature-dependent voltage $V_{EB}'$ and the temperature-dependent current $I_a$ can be substantially canceled by each other. The current $I_{bg}$ is thus temperature independent.

Referring again to FIG. 5, the current mirror 445 can mirror the temperature-independent current $I_{bg}$ to temperature-independent currents $I_{C1}'$ and $I_{C2}'$. The temperature-independent current $I_{C1}'$ can be provided to the current source 443. In some embodiments, the temperature-independent currents $I_{C1}'$ and $I_{C2}'$ can each be substantially equal or proportional to the temperature-independent current $I_{bg}$. In other embodiments, the temperature-independent current $I_{C1}'$ and/or $I_{C2}'$ can be proportional to the temperature-independent current $I_{bg}$ with the same or different proportional factors.

Referring to FIG. 5, the current mirror 447 can provide the current mirror 445 a current $$\frac{KV_{EB}'}{R_B'},$$

wherein $R_B'$ is the resistance of the resistor $R_2'$ and $KV_{EB}'$ is inversely proportional to absolute temperature. The current $$\frac{KV'_{EB}}{R'_B},$$

is temperature dependent. Since the current $$\frac{KV'_{EB}}{R'_B},$$

and the temperature-independent current $I_{C1}'$ are provided to the current mirror 443, the current mirror 441 can provide the resistor $R_1'$ a current $I_{ref}'$ that is temperature dependent and can be represented below as in Equation (4).

$$I'_{ref} = \frac{KV'_{EB}}{R'_B} - I'_{C1} \tag{4}$$

Since the current $I_{ref}'$ flows through the resistor $R_1'$, the temperature-dependent voltage $V_{ref}'$ on the input node 430a can be represented below as in Equation (5).

$$V'_{ref} = \left(\frac{KV'_{EB}}{R'_B} - I'_{C1}\right) \cdot R'_A \tag{5}$$

As noted, the temperature-dependent voltage $V_{ref}'$ can be programmable. In some embodiments, the temperature-dependent voltage $V_{ref}'$ can be programmed by adjusting at least one of the resistances $R_A'$, $R_B'$, the proportional factor K, and the temperature-independent current $I_{C1}'$.

In some embodiments for providing the temperature-dependent current $I_C'$, the current mirror 455 (shown in FIG. 5) can provide the resistor $R_3'$ a temperature-dependent current $$\frac{V'_{EB}}{R'_C},$$

wherein $R_C'$ represents the resistance of the resistor $R_3'$. The current mirror 455 can mirror the temperature-dependent current $$\frac{V'_{EB}}{R'_C}$$

to the current mirror 453.

In some embodiments, the current mirror 453 can receive a temperature-independent current $I_{C2}'$. In other embodiments, the temperature-independent current $I_{C2}'$ can be provided from the circuit 440 or the current mirror 445. Since the temperature-dependent current $$\frac{V'_{EB}}{R'_C}$$

and the temperature-independent current $I_{C2}'$ are provided to the current mirror 453, the current mirror 451 can provide the temperature-dependent current $I_C'$ that can be represented below in Equation (6).

$$I'_C = I'_{C2} - \frac{V'_{EB}}{R'_C} \tag{6}$$

As noted, the temperature-dependent current $I_C'$ can be programmable. In some embodiments, the temperature-dependent current $I_C'$ can be programmed by adjusting the resistance $R_C'$ and/or the temperature-independent current $I_{C2}'$.

In some embodiments, the environmental temperature around the integrated circuit 400 rises. If the environmental temperature increases, charge leakages of memory cells are increased. To retain data stored in the memory cells, the clock period should be shortened or the clock frequency should be increased. In this embodiment, the method 600 can include increasing the temperature-dependent current $I_C'$ and/or decreasing the temperature-dependent reference voltage $V_{ref}'$.

The method 600 can include comparing the temperature-dependent reference voltage $V_{ref}'$ and the voltage level on the node $N_A'$ of the capacitor 410 (FIG. 5) for controlling an open/close state of the switch 420 so as to generate a clock period (Step 620). If the voltage level on the node $N_A'$ is higher than the temperature-dependent reference voltage $V_{ref}'$, the comparator 430 can output a signal, closing the switch 420, such that charges stored in the capacitor 410 can be discharged. If the voltage level on the node $N_A'$ is lower than the voltage-dependent reference voltage $V_{ref}'$, the comparator 430 can output a signal, opening the switch 420, such that the current $I_C'$ can be supplied to charge the capacitor 410. By detecting the open/close state of the switch 420, a clock period that is provided for refreshing memory cells can be generated.

In some embodiments, a clock period (T') for refreshing memory cells can be represented below in Equation (7)

$$T' = C_x' V_{ref}' / I_C' \tag{7}$$

wherein, $C_x'$ represents the capacitance of the capacitor 410 and can be fixed. As noted, the clock period T' is inversely proportional to the current $I_C'$. If the environment temperature rises, the temperature-dependent current $I_C'$ can be increased and/or the temperature-dependent reference voltage $V_{ref}'$ can be decreased. Based on Equation (7), the clock period T' can be reduced and the refresh frequency can be increased.

In some embodiments, the environmental temperature around the integrated circuit 400 goes down. If the environmental temperature falls, charge leakages of memory cells become small. To retain data stored in the memory cells, the clock period can be longer or the clock frequency can be slowed down. In this embodiment, the method 600 can include decreasing the temperature-dependent current $I_C'$ and/or increasing the temperature-dependent reference voltage $V_{ref}'$. Based on Equation (7), the clock period T' can be proportionally increased and the clock frequency is decreased.

Figure 8:
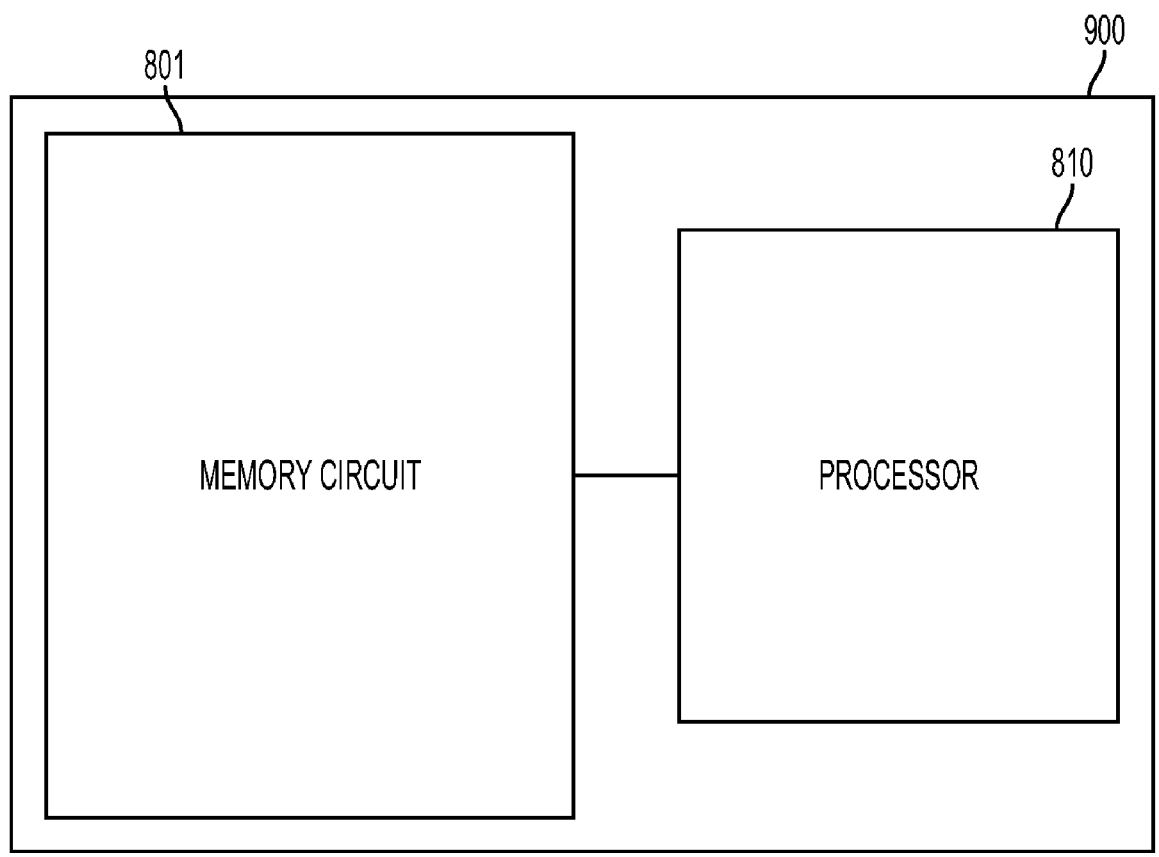
FIG. 8 is a schematic drawing showing a system including an exemplary memory circuit.

FIG. 8 is a schematic drawing showing a system including an exemplary memory circuit. In FIG. 8, a system 800 can include a processor 810 coupled with the memory circuit 801. The memory circuit 801 can be similar to a memory circuit that includes the integrated circuit 100 or 400 described above in conjunction with FIGS. 1A, 1B, 4, and 5. The processor 810 is capable of accessing the datum stored in the memory cell of the memory circuit 801. In some embodiments, the processor 810 can be a processing unit, central processing unit, digital signal processor, or other processor that is suitable for accessing data of memory circuit.

In some embodiments, the processor 810 and the memory circuit 801 can be formed within a system that can be physically and electrically coupled with a printed wiring board or printed circuit board (PCB) to form an electronic assembly. The electronic assembly can be part of an electronic system such as computers, wireless communication devices, computer-related peripherals, entertainment devices, or the like.

In some embodiments, the system 800 including the memory circuit 801 can provide an entire system in one IC, so-called system on a chip (SOC) or system on integrated circuit (SOIC) devices. These SOC devices may provide, for example, all of the circuitry needed to implement a cell phone, personal data assistant (PDA), digital VCR, digital camcorder, digital camera, MP3 player, or the like in a single integrated circuit.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit for providing a clock period, the integrated circuit comprising:
    a capacitor;
    a switch electrically coupled with the capacitor in a parallel fashion;
    a comparator including a first input node, a second input node, and a first output node, the second input node being electrically coupled with a first plate of the capacitor, the output node being electrically coupled with the switch;
    a transistor, separate from the switch, electrically coupled with a second plate of the capacitor during an entire period of operation; and
    a circuit electrically coupled with a gate of the transistor, the circuit being configured to provide a bias voltage to the gate of the transistor so as to control a current that is supplied to charge the capacitor.

2. The integrated circuit of claim 1, wherein the circuit comprises:
    a transconductance amplifier electrically coupled with the transistor and the capacitor;
    an amplifier including a third input node, a fourth input node, and a second output node, wherein the third input node is electrically coupled with the transconductance amplifier;
    a first resistor electrically coupled with the fourth input node; and
    a second resistor electrically coupled between the fourth input node and the second output node.

3. The integrated circuit of claim 2, wherein the transconductance amplifier is configured to convert a voltage drop between a fifth input node and a sixth input node of the transconductance amplifier to the current.

4. The integrated circuit of claim 2, wherein the third input node of the amplifier is configured to receive a reference voltage ($V_{ref}$), the first resistor is electrically coupled with a temperature-dependent voltage ($V_{EB}$), the first resistor has a first resistance ($R_A$), the second resistor has a second resistance ($R_B$), and the bias voltage ($V_{bias}$) is represented by following equation:

$$V_{bias} = V_{ref} + (V_{ref} - V_{EB}) \cdot \frac{R_B}{R_A}.$$

5. The integrated circuit of claim 4, wherein at least one of the first resistance and the second resistance is an adjustable resistance, and the bias voltage is adjustable by adjusting at least one of the first resistance and the second resistance.

6. The integrated circuit of claim 1, wherein
    the circuit is configured to increase the bias voltage to increase the current flowing through the transistor and a clock period that is inversely proportional to the current is decreased, if an environmental temperature around the integrated circuit is increased, and
    if the environmental temperature around the integrated circuit is decreased, the circuit is configured to increase the bias voltage to turn down the transistor such that the current is decreased and the clock period that is inversely proportional to the current is increased.

7. The integrated circuit of claim 4, wherein the reference voltage is temperature independent.

8. An integrated circuit for providing a clock period, the integrated circuit comprising:
    a capacitor;
    a switch coupled with the capacitor in a parallel fashion;
    a comparator including a first input node, a second input node, and a first output node, the second input node being electrically coupled with the capacitor, the first output node being electrically coupled with the switch;
    a first circuit electrically coupled with the first input node of the comparator, the first circuit being configured to provide a temperature-dependent reference voltage; and
    a second circuit electrically coupled with the capacitor, the second circuit being configured to provide a first temperature-dependent current that is supplied to charge the capacitor, wherein the temperature-dependent reference voltage and the first temperature-dependent current are programmable, and at least one of the temperature-dependent reference voltage and the first temperature-dependent current is adjusted so as to adjust a clock period for refreshing memory cells that are electrically coupled with the integrated circuit.

9. The integrated circuit of claim 8, wherein the first circuit comprises:
    a first resistor electrically coupled with the first input node of the comparator;
    a first current mirror electrically coupled with the first input node of the comparator;
    a second current mirror electrically coupled with the first current mirror;
    a third current mirror electrically coupled with the second current mirror;
    a fourth current minor electrically coupled with the second current mirror;
    a second resistor electrically coupled between the fourth current mirror and a power line that is configured to provide a power voltage; and
    a first amplifier including a third input node, a fourth input node, and a second output node, wherein the third input node of the first amplifier is configured to receive a first temperature-dependent voltage, the fourth input node of the first amplifier is electrically coupled with a node between the second resistor and the fourth current mirror, and the second output node of the first amplifier is electrically coupled with the fourth current mirror.

10. The integrated circuit of claim 9, wherein the first resistor has a resistance $R_A'$, the second resistor has a resistance $R_B'$, the first temperature-dependent voltage is $KV_{EB}'$, K is a proportional factor, $V_{EB}'$ is a voltage that is inversely proportional to absolute temperature, the third current mirror is configured to provide the second current mirror a first temperature-independent current, the fourth current mirror is configured to provide the second current mirror a second temperature-dependent current $$\left(\frac{KV'_{EB}}{R'_B}\right),$$

and wherein the temperature-dependent reference voltage ($V_{ref}'$) is represented by following equation:

$$V'_{ref} = \left(\frac{KV'_{EB}}{R'_B} - I'_{C1}\right) \cdot R'_A.$$

11. The integrated circuit of claim 10, wherein at least one of the resistances $R_A'$ and $R_B'$ is an adjustable resistance, and the temperature-dependent reference voltage ($V_{ref}'$) is programmable by adjusting at least one of the resistances $R_A'$ and $R_B'$, the proportion factor K, and the first temperature-independent current ($I_{C1}'$).

12. The integrated circuit of claim 9, wherein the second circuit comprises:
a fifth current mirror electrically coupled with the second input node of the comparator;
a sixth current mirror electrically coupled with the fifth current mirror;
a seventh current mirror electrically coupled with the sixth current mirror;
a third resistor electrically coupled between the seventh current mirror and a power line that is configured to provide a power voltage; and
a second amplifier including a fifth input node, a sixth input node, and a third output node, wherein the fifth input node of the second amplifier is configured to receive a second temperature-dependent voltage, the sixth input node of the second amplifier is electrically coupled with a node between the third resistor and the seventh current mirror, and the second output node of the first amplifier is electrically coupled with the seventh current mirror.

13. The integrated circuit of claim 12, wherein a third resistor has a resistance $R_C'$, the second temperature-dependent voltage is $V_{EB}'$, the seventh current mirror is configured to provide the sixth current mirror a third temperature-dependent current $$\left(\frac{V'_{EB}}{R'_C}\right),$$

the sixth current mirror is configured to receive a second temperature-independent current ($I_{C2}'$) from the first circuit, and the first temperature-dependent current ($I_C'$) is represented by following equation:

$$I'_C = \left(I'_{C2} - \frac{V'_{EB}}{R'_C}\right).$$

14. The integrated circuit of claim 13, wherein the resistance $R_C'$ is an adjustable resistance, and the temperature-dependent current ($I_C'$) is adjustable by adjusting at least one of the resistance $R_C'$ and the third temperature-independent current ($I_{C2}'$).

15. The integrated circuit of claim 9, wherein
if an environmental temperature around the integrated circuit is increased, the first circuit is configured to decrease the temperature-dependent reference voltage and/or the second circuit is configured to increase the first temperature-dependent current; and
if the environmental temperature around the integrated circuit is decreased, the first circuit is configured to increase the temperature-dependent reference voltage and/or the second circuit is configured to decrease the first temperature-dependent current.

16. A method of operating an integrated circuit for generating a clock period for refreshing memory cells of a memory circuit, the integrated circuit including a capacitor, a switch, a comparator, and a transistor, the switch being electrically coupled with the capacitor in a parallel fashion, the comparator being electrically coupled with the switch and the capacitor, the transistor being electrically coupled with the capacitor, the method comprising:
providing a bias voltage to a gate of the transistor so as to control a current that is supplied to charge the capacitor; and
comparing a temperature-independent reference voltage received by the comparator and a voltage level on a node of the capacitor for controlling an open/close state of the switch so as to generate the clock period.

17. The method of claim 16, wherein the bias voltage is provided by a circuit including:
a transconductance amplifier electrically coupled with the transistor and the capacitor;
an amplifier electrically coupled with the transconductance amplifier;
a first resistor electrically coupled with an input node of the amplifier; and
a second resistor electrically coupled between the input node and an output node of the amplifier.

18. The method of claim 17, wherein the temperature-independent reference voltage is $V_{ref}$, the first resistor is electrically coupled with a temperature-dependent voltage ($V_{EB}$), the first resistor has a first resistance ($R_A$), the second resistor has a second resistance ($R_B$), and the bias voltage ($V_{bias}$) is represented by following equation:

$$V_{bias} = V_{ref} + (V_{ref} - V_{EB}) \cdot \frac{R_B}{R_A}.$$

19. The method of claim 18, wherein at least one of the first resistance and the second resistance is an adjustable resistance, and the bias voltage is adjustable by adjusting at least one of the first resistance and the second resistance.

20. The method of claim 16, further comprising
the bias voltage is increased to turn up the transistor such that the current is increased and a clock period that is inversely proportional to the current is decreased, if an environmental temperature around the integrated circuit is increased; and
the bias voltage is decreased to turn down the transistor such that the current is decreased and the clock period that is inversely proportional to the current is increased, if the environmental temperature around the integrated circuit is decreased.

* * * * *